United States Patent
Park

(10) Patent No.: US 11,699,479 B2
(45) Date of Patent: Jul. 11, 2023

(54) NONVOLATILE MEMORY APPARATUS FOR GENERATING READ REFERENCE AND AN OPERATING METHOD OF THE NONVOLATILE MEMORY APPARATUS

(71) Applicant: SK hynix Inc., Icheon-si (KR)

(72) Inventor: Moo Hui Park, Icheon-si (KR)

(73) Assignee: SK hynix Inc., Icheon-si (KR)

(*) Notice: Subject to any disclaimer, the term of this patent is extended or adjusted under 35 U.S.C. 154(b) by 4 days.

(21) Appl. No.: 17/353,361

(22) Filed: Jun. 21, 2021

(65) Prior Publication Data

US 2022/0115055 A1  Apr. 14, 2022

(30) Foreign Application Priority Data

Oct. 14, 2020 (KR) .................. 10-2020-0132521

(51) Int. Cl.
| G11C 8/08 | (2006.01) |
| G11C 11/4091 | (2006.01) |
| G11C 11/408 | (2006.01) |
| G11C 11/4074 | (2006.01) |
| G11C 11/4094 | (2006.01) |
| G11C 11/4099 | (2006.01) |

(52) U.S. Cl.
CPC ...... G11C 11/4091 (2013.01); G11C 11/4074 (2013.01); G11C 11/4085 (2013.01); G11C 11/4094 (2013.01); G11C 11/4099 (2013.01)

(58) Field of Classification Search
CPC .................................. G11C 11/4091
See application file for complete search history.

(56) References Cited

U.S. PATENT DOCUMENTS

| 9,747,978 B2* | 8/2017 | Srinivasan | G11C 7/12 |
| 2011/0032753 A1* | 2/2011 | An | H01L 27/101 |
| | | | 365/163 |
| 2011/0188311 A1* | 8/2011 | Stiegler | G11C 16/06 |
| | | | 365/207 |
| 2015/0055407 A1* | 2/2015 | Mantegazza | G11C 13/0038 |
| | | | 365/163 |
| 2015/0294716 A1* | 10/2015 | Tortorelli | G11C 11/5678 |
| | | | 365/163 |

* cited by examiner

*Primary Examiner* — Min Huang
(74) *Attorney, Agent, or Firm* — William Park & Associates Ltd.

(57) ABSTRACT

A nonvolatile memory apparatus may include a control circuit, a sense amplifier, and a reference generator. The control circuit may apply a read voltage across a target memory cell through a selected global bit line and a selected global word line. The sense amplifier may generate an output signal by comparing voltage levels of the selected global word line and a reference line. The reference generator may change the voltage level of the reference line by charging and discharging a capacitor that is coupled to the reference line.

22 Claims, 8 Drawing Sheets

NONVOLATILE MEMORY APPARATUS FOR GENERATING READ REFERENCE AND AN OPERATING METHOD OF THE NONVOLATILE MEMORY APPARATUS

CROSS-REFERENCES TO RELATED APPLICATION

The present application claims priority under 35 U.S.C. § 119(a) to Korean application number 10-2020-0132521, filed on Oct. 14, 2020, in the Korean Intellectual Property Office, which is incorporated herein by reference in its entirety.

BACKGROUND

1. Technical Field

Various embodiments generally relate to a memory apparatus, and more particularly, to a nonvolatile memory apparatus and an operating method thereof.

2. Related Art

An electronic device may include a number of electronic components. Specifically, the electronic device may include a number of electronic components each with computer system semiconductors. The computer system may include a memory apparatus. DRAM can store and output data at high and constant speed, and perform random access. Thus, DRAM is widely used as a general memory apparatus. However, since DRAM includes memory cells each with a capacitor, DRAM has a volatile characteristic of losing data that stored therein when power supplied thereto is removed. In order to overcome such a disadvantage, flash memory has been developed. Hash memory may include memory cells each constituted by a floating gate, and thus have a nonvolatile characteristic of retaining data that is stored therein even though power supplied thereto is removed. However, flash memory has lower data storage and output speed than the DRAM, and flash memory also has difficulties in performing random access.

Recently, next-generation memory apparatuses, such as a phase change RAM, magnetic RAM, resistive RAM and ferroelectric RAM, which have high operating speed and nonvolatile characteristics, have been developed. The next-generation memory apparatuses may operate at high speed with nonvolatile characteristics. In particular, the PRAM may include memory cells, each formed of a chalcogenide compound, and store data by changing the resistance value of a memory cell.

SUMMARY

In an embodiment, a nonvolatile memory apparatus may include a control circuit, a sense amplifier, and a reference generator. The control circuit may be configured to apply a read voltage across a target memory cell through a selected global bit line and a selected global word line. The sense amplifier may be configured to generate an output signal by comparing voltage levels of the selected global word line and a reference line. The reference generator may be configured to change the voltage level of the reference line by charging and discharging a capacitor that is coupled to the reference line.

In an embodiment, an operating method of a nonvolatile memory apparatus includes accessing a target memory cell that is coupled between a selected bit line and a selected word line. The operating method may include applying a first read boundary voltage to the selected bit line, applying a second read boundary voltage to the selected word line, and precharging a reference line to the second read boundary voltage. The operating method may include raising the voltage level of the reference line by providing a first low voltage to a capacitor that is coupled to the reference line. And the operating method may include generating an output signal by comparing the voltage level of the selected word line, which is changed according to data that is stored in the target memory cell, to the voltage level of the reference line.

In an embodiment, a nonvolatile memory apparatus may include a first global word line, a second global word line, a sense amplifier, and a reference generator. The first global word line may be coupled to a first memory cell. The second global word line may be coupled to a second memory cell. The sense amplifier may comprise a first input terminal that is coupled to a global word line, coupled to one memory cell, which is accessed, between the first and second memory cells and a second input terminal that is coupled to a global word line, coupled to the other memory cell, which is not accessed. The sense amplifier may be configured to generate an output signal by comparing the voltage levels of the first and second input terminals. The reference generator may be configured to change the voltage level of the second input terminal by charging and discharging a capacitor that is coupled to the second input terminal.

DETAILED DESCRIPTION

Figure 1:
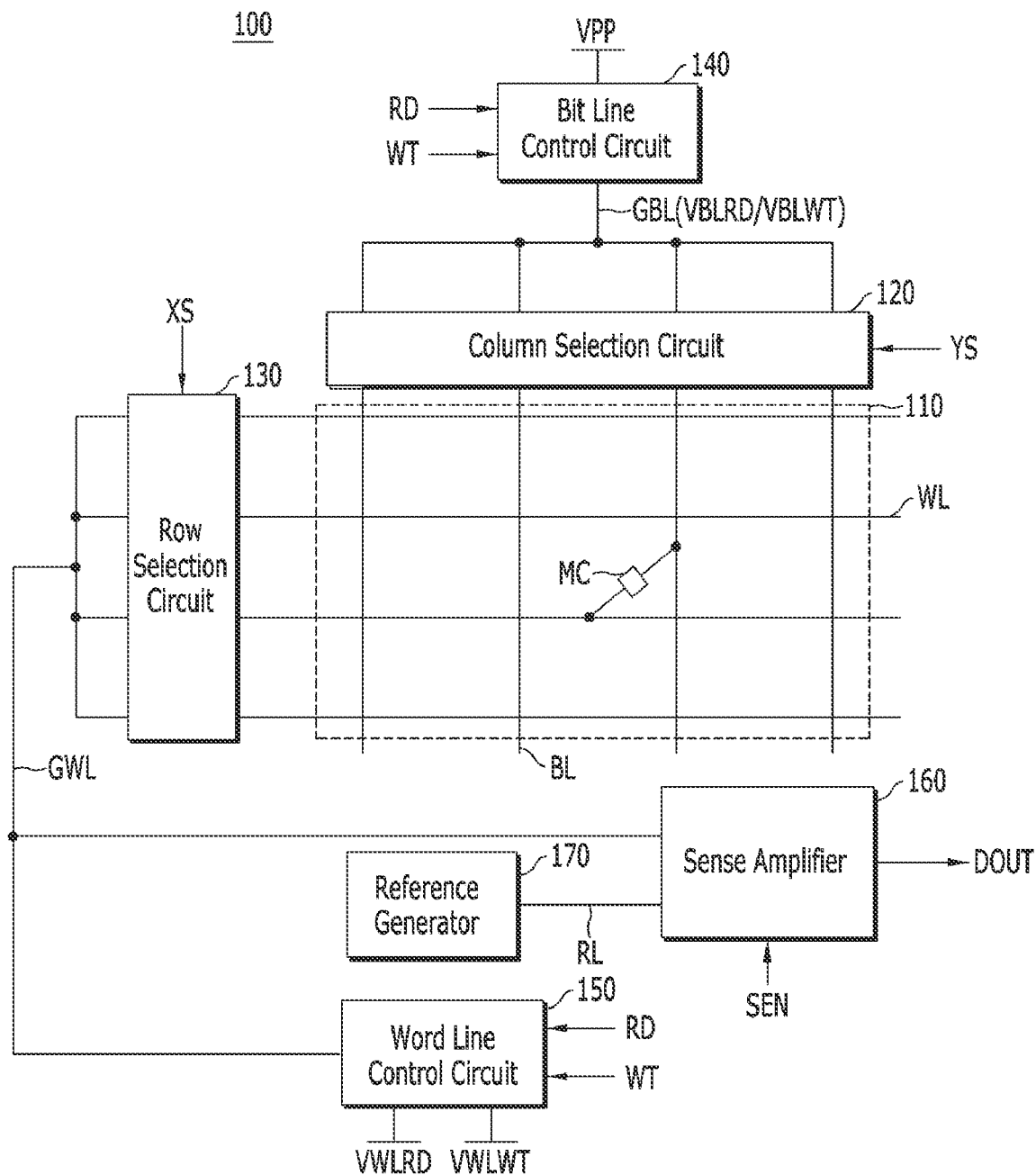
FIG. 1 is a diagram illustrating a configuration of a nonvolatile memory apparatus in accordance with an embodiment.

FIG. 1 is a diagram illustrating a configuration of a nonvolatile memory apparatus 100 in accordance with an embodiment. Referring to FIG. 1, the nonvolatile memory apparatus 100 may include a memory cell array 110. The memory cell array 110 may include a plurality of bit lines BL that are arranged in a column direction and a plurality of word lines WL that are arranged in a row direction. The memory cell array 110 may include a plurality of memory cells MC that are coupled to the respective intersections between the plurality of bit lines BL and the plurality of word lines WL. The plurality of memory cells MC may be each coupled between the bit line BL and the word line WL, which correspond thereto. The memory cell MC may be configured as a variable resistance element. For example, the memory cell MC may include a phase change material. The nonvolatile memory apparatus 100 may be a resistive memory apparatus or phase change memory apparatus. The memory cell array 110 may be configured as a cross-point array.

Each of the memory cells MC may include a storage element and a switching element, which are coupled to each other. The storage element may retain a physical state that corresponds to data that is stored therein for a long term, even though a refresh or re-write operation is not performed. The plurality of memory cells MC may be each accessed when a voltage that is equal to or higher than a threshold voltage is applied to the switching element coupled to the storage element. When a voltage that is equal to or higher than the threshold voltage is applied to the switching element, the switching element may be turned on and/or snapped back so that a current can flow through the memory cell. The storage element may include a floating gate of a dual gate transistor, a phase change material, a variable resistance material or the like, and the nonvolatile memory apparatus may include a PCM (Phase Change Memory), RRAM (Resistive RAM), STTMRAM (Spin Torque Transfer RAM) or the like. The switching element may include a 2-terminal switching element such as a diode, ovonic threshold switch, tunnel junction or mixed ion electric conductor. In an embodiment, the switching element may include a 3-terminal switching element such as a field effect transistor or bipolar junction transistor.

The memory cell array 110 may have a hierarchical connection structure. The memory cell array 110 may include a plurality of global bit lines GBL and a plurality of local bit lines (not illustrated), which are arranged therein. The plurality of global bit lines GBL may be coupled to the plurality of local bit lines. The plurality of local bit lines may be coupled to the plurality of bit lines BL, respectively. Therefore, a memory cell MC of the memory cell array 110 may be accessed while a global bit line GBL, a local bit line, and a bit line BL are sequentially selected. The memory cell array 110 may include a plurality of global word lines GWL and a plurality of local word lines (not illustrated), which are arranged therein. The plurality of global word lines GWL may be each coupled to a plurality of local word lines. The plurality of local word lines may be coupled to the plurality of word lines WL, respectively. A memory cell of the memory cell array 110 may be accessed while a global word line GWL, a local word line, and a word line WL are sequentially selected.

The nonvolatile memory apparatus 100 may include a column selection circuit 120 and a row selection circuit 130. The column selection circuit 120 may be coupled between the global bit line GBL and the plurality of bit lines BL. The column selection circuit 120 may couple a bit line, selected among the plurality of bit lines BL, to the global bit line GBL. The column selection circuit 120 may select a specific bit line among the plurality of bit lines BL based on a column select signal YS which can be generated based on a column address signal, and couple the selected bit line to the global bit line GBL. The row selection circuit 130 may be coupled between the global word line GWL and the plurality of word lines WL. The row selection circuit 130 may couple a word line, selected among the plurality of word lines WL, to the global word line GWL. The row selection circuit 130 may select a specific word line among the plurality of word lines WL based on a row select signal XS that can be generated based on a row address signal, and the row selection circuit 130 may couple the selected word line to the global word line GWL.

The nonvolatile memory apparatus 100 may include a control circuit to access a memory cell MC of the memory cell array 110. The control circuit may receive a command signal, an address signal, a data signal, and the like from a controller of the nonvolatile memory apparatus 100, access the memory cell MC based on the command signal, the address signal and the data signal, and write data to the memory cell MC or read the data that is stored in the memory cell MC. The control circuit may include a bit line control circuit 140 and a word line control circuit 150. The bit line control circuit 140 may be coupled to the global bit line GBL. The bit line control circuit 140 may change the voltage level of the global bit line GBL for read and write operations of the nonvolatile memory apparatus 100. The bit line control circuit 140 may receive a read signal RD and a write signal WT, and the bit line control circuit 140 may change the voltage level of the global bit line GBL.

The read signal RD and the write signal WT may be generated based on the command signal that is received from the controller. The read signal RD may be enabled when the nonvolatile memory apparatus 100 performs a read operation. The read operation may indicate an operation in which the nonvolatile memory apparatus 100 reads data that is stored in the memory cell array 110 and outputs the read data to the controller of the nonvolatile memory apparatus 100. The write signal WT may be enabled when the nonvolatile memory apparatus 100 performs a write operation. The write operation may indicate an operation in which the nonvolatile memory apparatus 100 stores or programs a data signal, received from the controller, into the memory cell array 110. The write operation may include a reset write operation and a set write operation. The write signal WT may include a reset write signal and a set write signal. The memory cell MC may be programmed into a low resistance state or high resistance state to store data. In an embodiment, the memory cell MC may have a plurality of low resistance states and a plurality of high resistance states, and the memory cell MC may store mufti-bit data that is specified by the plurality of low resistance states and the plurality of high resistance states. The reset write signal may be a signal for programming the memory cell MC into a high resistance state, and the set write signal may be a signal for programming the memory cell MC into a low resistance state.

The bit line control circuit 140 may provide one or more voltages to the global bit line GBL based on the read signal RD and the write signal WT. For example, the bit line control circuit 140 may receive a supply voltage VPP and may provide a first read boundary voltage VBLRD to the global bit line GBL based on the read signal RD during the read operation. The first read boundary voltage VBLRD may have a lower voltage level than the supply voltage VPP. The bit line control circuit 140 may apply a first write boundary voltage VBLWT to the global bit line GBL based on the write signal WT during the write operation. The first write boundary voltage VBLWT may have a voltage level equal to or lower than the supply voltage VPP and higher than the first read boundary voltage VBLRD. Although will be described below, the voltage level of the first read boundary voltage VBLRD may be set so that a read voltage is applied across the memory cell MC, and the voltage level of the first write boundary voltage VBLWT may be set so that a write voltage is applied across the memory cell MC. The read voltage may have a proper voltage level to determine the resistance state of the memory cell MC. For example, the read voltage may have a voltage level higher than the maximum threshold voltage of the distribution of memory cells in the low resistance states and lower than the minimum threshold voltage of the distribution of memory cells in the high resistance states.

The word line control circuit 150 may be coupled to the global word line GWL. The word line control circuit 150 may change the voltage level of the global word line GWL for read and write operations of the nonvolatile memory apparatus 100. The word line control circuit 150 may receive the read signal RD and the write signal WT, and provide one or more voltages to the global word line GWL. The word line control circuit 150 may change a current that is flowing through the memory cell MC by changing the current that is flowing through the global word line GWL based on the read signal RD and the write signal WT.

The word line control circuit 150 may provide one or more voltages and one or more currents to the global word line GWL based on the read signal RD and the write signal WT. For example, the word line control circuit 150 may receive a second read boundary voltage VWLRD and may provide the second read boundary voltage VWLRD to the global word line GWL based on the read signal RD during the read operation. The second read boundary voltage VWLRD may have a lower voltage level than the first read boundary voltage VBLRD. For example, the second read boundary voltage VWLRD may be a negative voltage with a voltage level equal to or less than a ground voltage. The voltage level of the second read boundary voltage VWLRD may be set so that a voltage level difference between the first and second read boundary voltages VBLRD and VWLRD corresponds to the level of the read voltage. The word line control circuit 150 may allow a clamping current to flow through the global word line GWL based on the read signal RD. When the memory cell MC is turned on, the clamping current may have a minimum current amount to change the voltage level of the global word line GWL according to the resistance state of the memory cell MC.

The word line control circuit 150 may receive a second write boundary voltage VWLWT and may apply the second write boundary voltage VWLWT to the global word line GWL based on the write signal WT. The second write boundary voltage VWLWT may have a voltage level equal to or lower than the second read boundary voltage VWLRD. The voltage level of the second write boundary voltage VWLWT may be set so that the voltage level difference between the first and second write boundary voltages VBLWT and VWLWT corresponds to the level of the write voltage. The word line control circuit 150 may allow various currents to flow through the global word line GWL based on the write signal WT. For example, the word line control circuit 150 may allow a set current to flow through the global word line GWL to program the memory cell MC into a low resistance state based on the set write signal. The word line control circuit 150 may allow a reset current to flow through the global word line GWL to program the memory cell MC into a high resistance state based on the reset write signal. The set current may be lower than the reset current. The amount of time it takes for the set current to flow to program the memory cell MC into a low resistance state may be longer than the amount of time it takes for the reset current to flow to program the memory cell MC into a high resistance state.

The nonvolatile memory apparatus may further include a sense amplifier 160 and a reference generator 170. The sense amplifier 160 may be coupled to the global word line GWL. The sense amplifier 160 may be coupled to a reference line RL. During a read operation of the nonvolatile memory apparatus 100, the sense amplifier 160 may generate an output signal DOUT by comparing the voltage level of the global word line GWL to the voltage level of the reference line RL. During the read operation, the voltage level of the global word line GWL may be changed according to data that is stored in a memory cell MC coupled to the global word line GWL. The voltage level of the global word line GWL may be changed between a set sensing voltage and a reset sensing voltage. When the memory cell MC is in a low resistance state, the voltage level of the global word line GWL may be changed to the voltage level of the set sensing voltage. When the memory cell MC is in a high resistance state, the voltage level of the global word line GWL may be changed to the reset sensing voltage with a lower voltage level than the set sensing voltage. The sense amplifier 160 may further receive a sensing enable signal SEN. The sensing enable signal SEN may be enabled after a change in voltage level of the global word line GWL sufficiently develops based on data that is stored in the memory cell MC. The sensing enable signal SEN may be enabled in the form of a pulse at a random point in time between a point in time at which a snapback of the memory cell occurs after the read voltage is applied to the memory cell MC and a point in time at which the read operation is ended.

The reference generator 170 may be coupled to the reference line RL. The reference generator 170 may change the voltage level of the reference line RL. The reference generator 170 may set the voltage level of the reference line RL to a voltage level that corresponds to a reference voltage. The reference voltage may have a voltage level between the set sensing voltage and the reset sensing voltage. Desirably, the reference voltage may have a voltage level that corresponds to the middle and/or average between the set sensing voltage and the reset sensing voltage. The reference generator 170 may include a capacitor coupled to the reference line RL and may change the voltage level of the reference line RL by charging or discharging the capacitor.

Although not illustrated, the control circuit may further include a column decoding circuit and a row decoding circuit. The column decoding circuit may generate a column address signal based on the address signal that is received from the controller and may generate the column select signal YS to select a global bit line GBL and a bit line BL, which are coupled to a memory cell MC to be accessed, based on the column address signal. The row decoding circuit may generate a row address signal based on the address signal that is received from the controller and may generate the row select signal XS to select a global word line GWL and a word line WL, which are coupled to a memory cell MC to be accessed, based on the row address signal.

Figure 2:
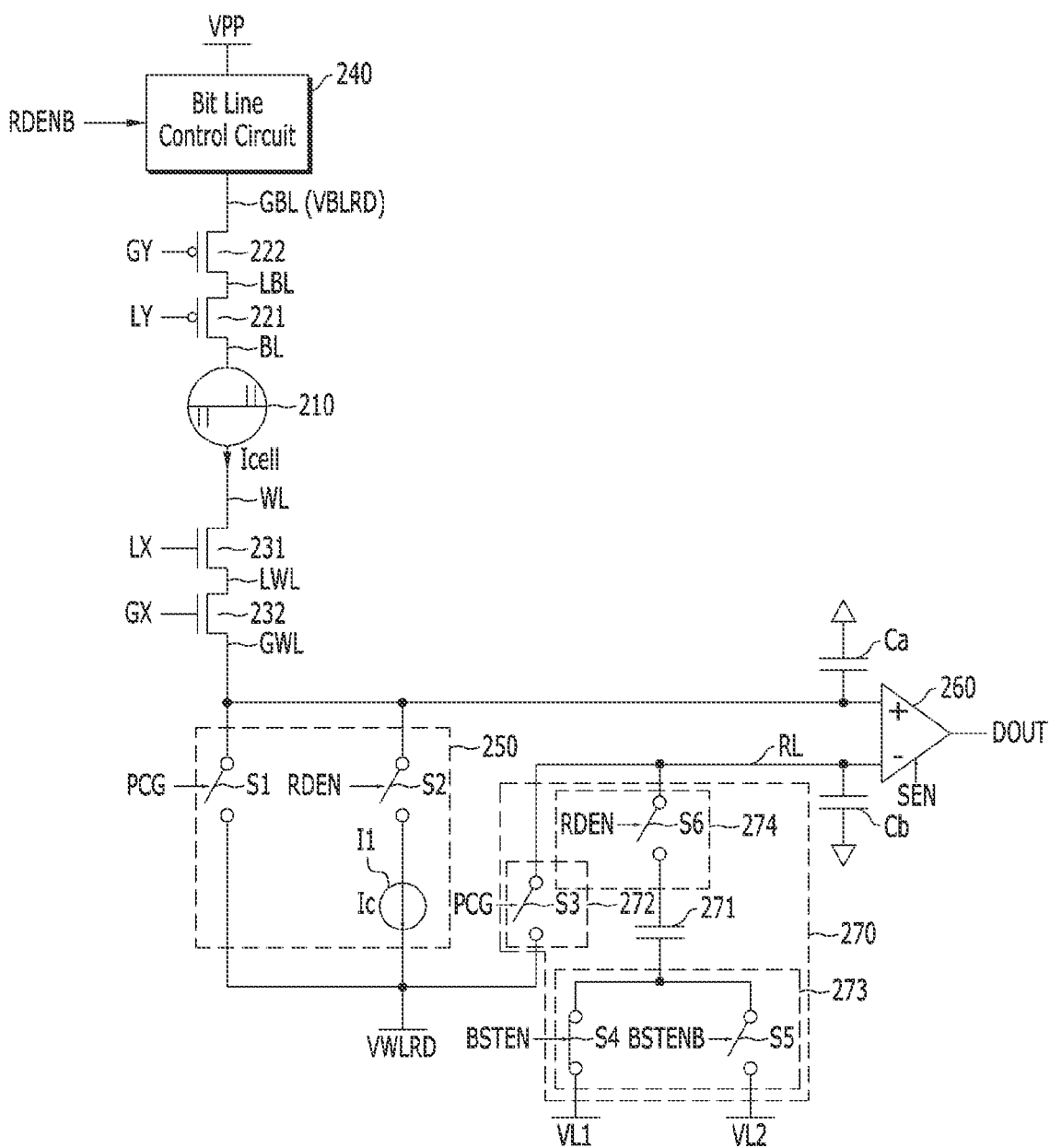
FIG. 2 is a diagram illustrating a configuration of a nonvolatile memory apparatus in accordance with an embodiment.

FIG. 2 is a diagram illustrating a configuration of a nonvolatile memory apparatus 200 in accordance with an embodiment. FIG. 2 partially illustrates components for accessing a memory cell to perform a read operation, among the components of the nonvolatile memory apparatus 100 illustrated in FIG. 1. The accessed memory cell may be referred to as a target memory cell. Referring to FIG. 2, the nonvolatile memory apparatus 200 may include a memory cell 210, and the memory cell 210 may have one end that is coupled to a bit line BL and the other end that is coupled to a word line WL. The bit line BL may be coupled to a global bit line GBL through a local bit line LBL, and the word line WL may be coupled to a global word line GWL through a local word line LWL.

The nonvolatile memory apparatus 200 may include a bit line control circuit 240, a word line control circuit 250, a sense amplifier 260, and a reference generator 270. The bit line control circuit 240 may receive a supply voltage VPP and may provide a first read boundary voltage VBLRD to the global bit line GBL based on a read control signal RDEN. Since the bit line control circuit 240 may include a P-channel MOS transistor, the bit line control circuit 240 may receive a complementary signal RDENB of the read control signal and operate according to the received signal. The read control signal RDEN may be generated from the read signal RD of FIG. 1. The word line control circuit 250 may provide a second read boundary voltage VWLRD to the global word line GWL based on the read control signal RDEN. The word line control circuit 250 may allow a clamping current is to flow through the global word line GWL based on the read control signal RDEN. The word line control circuit 250 may precharge the voltage level of the global word line GWL to the second read boundary voltage VWLRD based on a precharge signal PCG. The precharge signal PCG may be generated from the read control signal RDEN.

The sense amplifier 260 may be coupled to the global word line GWL and the reference line RL, and the sense amplifier 260 may generate an output signal DOUT by comparing the voltage level of the global word line GWL and the voltage level of the reference line RL. The sense amplifier 260 may include a first input terminal (+) and a second input terminal (−). The first input terminal (+) may be coupled to the global word line GWL, and the second input terminal (−) may be coupled to the reference line RL. The voltage level of the global word line GWL may be changed according to data that is stored in the memory cell 210. The voltage level of the global word line GWL may be changed to a set sensing voltage when the memory cell 210 is in a low resistance state, and changed to a reset sensing voltage when the memory cell 210 is in a high resistance state.

The reference generator 270 may precharge the voltage level of the reference line RL based on the read control signal RDEN and may set the voltage level of the reference line RL to a voltage level that corresponds to a reference voltage. The reference voltage may have a voltage level between the set sensing voltage and the reset sensing voltage. Desirably, the reference voltage may have a voltage level that corresponds to the middle and/or average between the set sensing voltage and the reset sensing voltage. The reference generator 270 may include a capacitor 271 that is coupled to the reference line RL. The reference generator 270 may charge or discharge the capacitor 271 by providing the capacitor 271 with one of a first low voltage VL1 and a second low voltage VL2, thereby changing the voltage level of the reference line RL. The first low voltage VL1 may have a higher voltage level than the second low voltage VL2 and may have a higher voltage level than the second read boundary voltage VWLRD. The first low voltage VL1 may have a lower voltage level than the first read boundary voltage VBLRD. The second low voltage VL2 may have a voltage level equal to or lower than the second read boundary voltage VWLRD. The reference generator 270 may provide the first low voltage VL1 to the capacitor 271 to raise the voltage level of the reference line RL and may provide the second low voltage VL2 to the capacitor 271 to discharge the capacitor 271. Based on a boosting control signal BSTEN, the reference generator 270 may provide one of the first and second low voltages VL1 and VL2 to the capacitor 271 that is coupled to the reference line RL. The boosting control signal BSTEN may be generated based on the precharge signal PCG and the read control signal RDEN.

The nonvolatile memory apparatus 200 may include a local column switch 221, a global column switch 222, a local row switch 231, and a global row switch 232. The local column switch 221 and the global column switch 222 may be components of the column selection circuit 120 of FIG. 1, and the local row switch 231 and the global row switch 232 may be components of the row selection circuit 130 of FIG. 1. The local column switch 221 may couple a bit line BL, coupled to the memory cell 210, to the local bit line LBL based on a local column select signal LY. The global column switch 222 may couple the local bit line LBL to the global bit line GBL based on a global column select signal GY. The column select signal YS of FIG. 1 may include the local column select signal LY and the global column select signal GY. The local row switch 231 may couple a word line WL, coupled to the memory cell 210, to the local word line LWL based on a local row select signal LX. The global row switch 232 may couple the local word line LWL to the global word line GWL based on a global row select signal GX. The row select signal XS of FIG. 1 may include the local row select signal LX and the global row select signal GX.

The word line control circuit 250 may include a first switch S1, a second switch S2, and a current source I1. The first switch S1 may be coupled between the global word line GWL and the terminal to which the second read boundary voltage VWLRD is supplied and may receive the precharge signal PCG. When the precharge signal PCG is enabled, the first switch S1 may couple the global word line GWL to the terminal to which the second read boundary voltage VWLRD is supplied and may precharge the global word line GWL to the second read boundary voltage VWLRD. The second switch S2 may be coupled between the global word line GWL and the current source I1, and the second switch S2 may receive the read control signal RDEN. The second switch S2 may couple the global word line GWL and the current source I1 when the read control signal RDEN is enabled. The current source I1 may be coupled between the second switch S2 and the terminal to which the second read boundary voltage VWLRD is supplied. The current source I1 may generate the clamping current Ic. When the read control signal RDEN is enabled, the current source I1 may allow the clamping current Ic to flow through the global word line GWL.

The reference generator 270 may include the capacitor 271, a precharge circuit 272, and a boosting control circuit 273. The precharge circuit 272 may receive the precharge signal PCG and may precharge the reference line RL to the second read boundary voltage VWLRD based on the precharge signal PCG. When the precharge signal PCG is enabled, the precharge circuit 272 may provide the second read boundary voltage VWLRD to the reference line RL and may change the voltage level of the reference line RL to a voltage level that corresponds to the second read boundary voltage VWLRD. The capacitor 271 may be a boosting capacitor for boosting the voltage level of the reference line RL. The capacitor 271 may have one end that is coupled to the reference line RL and the other end that is coupled to the boosting control circuit 273. The boosting control circuit 273 may charge or discharge the capacitor 271 by providing one of the first and second low voltages VL1 and VL2 to the capacitor 271 based on the boosting control signal BSTEN. When the boosting control signal BSTEN is enabled, the boosting control circuit 273 may provide the first low voltage VL1 to the capacitor 271 to charge the capacitor 271. When the boosting control signal BSTEN is disabled, the boosting control circuit 273 may provide the second low voltage VL2 to the capacitor 271 to discharge the capacitor 271.

The reference generator 270 may further include a reference switching circuit 274. The reference switching circuit 274 may receive the read control signal RDEN and may couple the reference line RL and the capacitor 271 based on the read control signal RDEN. When the read control signal RDEN is enabled, the reference switching circuit 274 may couple the reference line RL to the capacitor 271. When the read control signal RDEN is disabled, the reference switching circuit 274 may electrically isolate the capacitor 271 from the reference line RL, thereby preventing a change in voltage level of the reference line RL based on the capacitor 271 and preventing constant current consumption.

The precharge circuit 272 may include a third switch S3. The third switch S3 may be coupled between the reference line RL and the terminal to which the second read boundary voltage VWLRD is supplied, and receive the precharge signal PCG. When the precharge signal PCG is enabled, the third switch S3 couple the reference line RL to the terminal to which the second read boundary voltage VWLRD is supplied.

The boosting control circuit 273 may include a fourth switch 54 and a fifth switch S5. The fourth switch 54 may be coupled between the other end of the capacitor 271 and the terminal to which the first low voltage VL1 is supplied and may receive the boosting control signal BSTEN. When the boosting control signal BSTEN is enabled, the fourth switch 54 may couple the other end of the capacitor 271 to the terminal to which the first low voltage VL1 is supplied. The fifth switch S5 may be coupled between the other end of the capacitor 271 and the terminal to which the second low voltage VL2 is supplied and may receive a complementary signal BSTENB of the boosting control signal BSTEN. When the boosting control signal BSTEN is disabled, the fifth switch S5 may couple the other end of the capacitor 271 to the terminal to which the second low voltage VL2 is supplied.

The reference switching circuit 274 may include a sixth switch S6. The sixth switch S6 may be coupled between the reference line RL and the one end of the capacitor 271, and the sixth switch S6 may receive the read control signal RDEN. When the read control signal RDEN is enabled, the sixth switch 6 may couple the capacitor 271 to the reference line RL.

Figure 3:
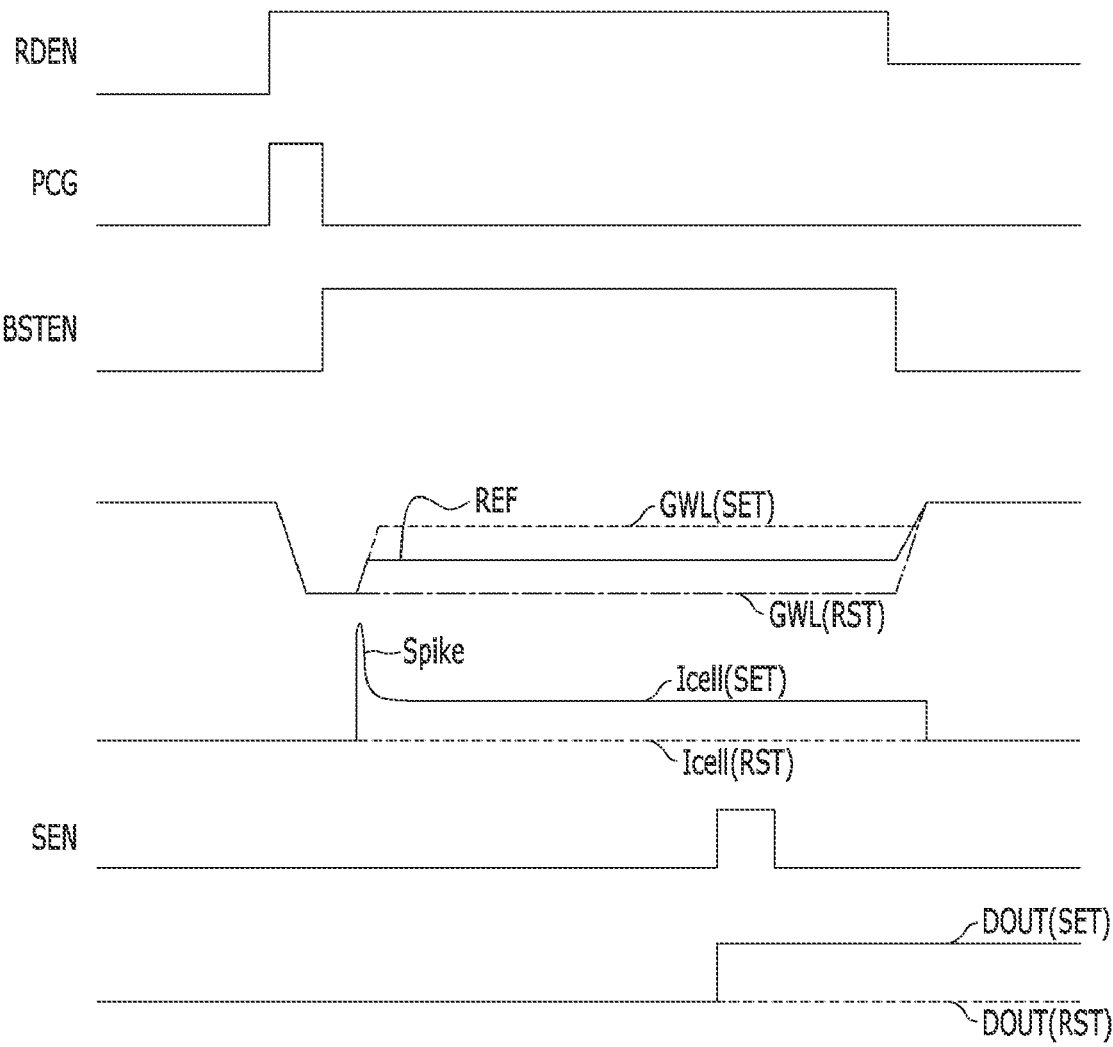
FIG. 3 is a timing diagram illustrating an operation of a nonvolatile memory apparatus in accordance with an embodiment.

FIG. 3 is a timing diagram illustrating an operation of a nonvolatile memory apparatus in accordance with an embodiment, Referring to FIGS. 1 to 3, the operation of the nonvolatile memory apparatus 200 in accordance with the present embodiment will be described as follows. The controller of the nonvolatile memory apparatus 200 may provide a command signal and an address signal to the nonvolatile memory apparatus 200 in order to read data that is stored in a target memory cell 210. The control circuit of the nonvolatile memory apparatus 200 may enable the read signal RD based on the command signal and may generate the column select signal YS and the row select signal XS based on the address signal. When the global column select signal GY and the local column select signal LY are enabled, a bit line BL, a local bit line LBL, and a global bit line GBL, which are to be coupled to the target memory cell 210, may be selected. When the global row select signal GX and the local row select signal LX are enabled, a word line WL, a local word line LWL, and a global word line GWL, which are to be coupled to the target memory cell 210, may be selected. The voltage level of the selected global word line GWL may be retained at an initial voltage level Vint. The initial voltage level Vint may indicate the voltage level of the global word line when an access operation on the memory cell is not performed. For example, the initial voltage level Vint may correspond to a ground voltage.

The read control signal RDEN may be enabled based on the read signal RD. The read control signal RDEN may continuously retain the enable state while the read operation is performed. When the read control signal RDEN is enabled, the precharge signal PCG may be enabled in the form of a pulse. The word line control circuit 250 may precharge the selected global word line GWL to the voltage level of the second read boundary voltage VWLRD based on the precharge signal PCG. When the precharge signal PCG is enabled, the reference generator 270 may precharge the reference line RL to the second read boundary voltage VWLRD. Therefore, when the precharge signal PCG is enabled, the voltage levels of the selected global word line GWL and the reference line RL may be equalized. The reference generator 270 may couple the capacitor 271 to the reference line RL based on the read control signal RDEN.

The bit line control circuit 240 may provide the first read boundary voltage VBLRD to the selected global bit line GBL based on the read control signal RDEN, and the voltage level of the selected global bit line GBL may rise to a voltage level that corresponds to the first read boundary voltage VBLRD. The word line control circuit 250 may provide the second read boundary voltage VWLRD to the selected global word line GWL based on the read control signal RDEN and may allow the clamping current Ic to flow through the selected global word line GWL. Therefore, the voltage level of the selected global word line GWL may fall from the initial voltage level Vint to a voltage level that corresponds to the second read boundary voltage VWLRD, and a read voltage may be applied across the target memory cell 210. When the precharge signal PCG is disabled, the reference line RL may be floated, and the boosting control signal BSTEN may be enabled. When the boosting control signal BSTEN is enabled, the boosting control circuit 273 may provide the first low voltage VL1 to the capacitor 271, and the capacitor 271 may be charged to boost the voltage level of the reference line RL. Therefore, the voltage level of the reference line RL may rise to a voltage level that corresponds to a reference voltage REF.

When data that is stored in the target memory cell 210 is set data and the target memory cell 210 is in a low resistance state (indicated by a dotted line), the target memory cell 210 may be snapped back by the read voltage, and the amount of current Icell that is flowing through the target memory cell 210 may be rapidly increased to cause a spike. After the spike is caused, the current that is flowing through the target memory cell 210 may correspond to the damping current Ic, and the voltage level of the selected global word line GWL may rise to the level of a set sensing voltage GWL (SET). When the sensing enable signal SEN is enabled, the sense amplifier 260 may compare the voltage levels of the selected global word line GWL and the reference line RL. Since the voltage level of the selected global word line GWL is higher than the voltage level of the reference line RL, the sense amplifier 260 may generate an output signal DOUT with a logic high level.

When the data that is stored in the target memory cell 210 is reset data and the target memory cell 210 is in a high resistance state (indicated by an alternated long and short dash line), the target memory cell 210 might not be snapped back even though the read voltage is applied thereto. Therefore, the amount of current Icell flowing through the memory cell 210 might not be changed, and the voltage level of the selected global word line GWL may have the voltage level of the reset sensing voltage GWL (RST) while retained at a precharge voltage level. When the sensing enable signal SEN is enabled, the sense amplifier 260 may compare the voltage levels of the selected global word line GWL and the reference line RL. Since the voltage level of the selected global word line GWL is lower than the voltage level of the reference line RL, the sense amplifier 260 may generate the output signal DOUT with a logic low level.

The reference generator 270 may precharge the reference line RL to a voltage level equal to the voltage level of the selected global word line GWL and then boost the voltage level of the reference line RL through the capacitor 271 that is coupled to the reference line RL, thereby forming a reference for sensing the voltage level of the selected global word line GWL. Therefore, the reference generator 270 may generate a valid reference within such a range that the voltage level of the selected global word line GWL is changed through the embodiment. Furthermore, as the nonvolatile memory apparatus 200 includes the reference generator 270, it is possible to remove a conventional reference voltage generation circuit and a global line through which the reference voltage generation circuit provides the reference voltage to the sense amplifier 260. Therefore, the core area efficiency of the nonvolatile memory apparatus 200 may be improved.

Figure 4:
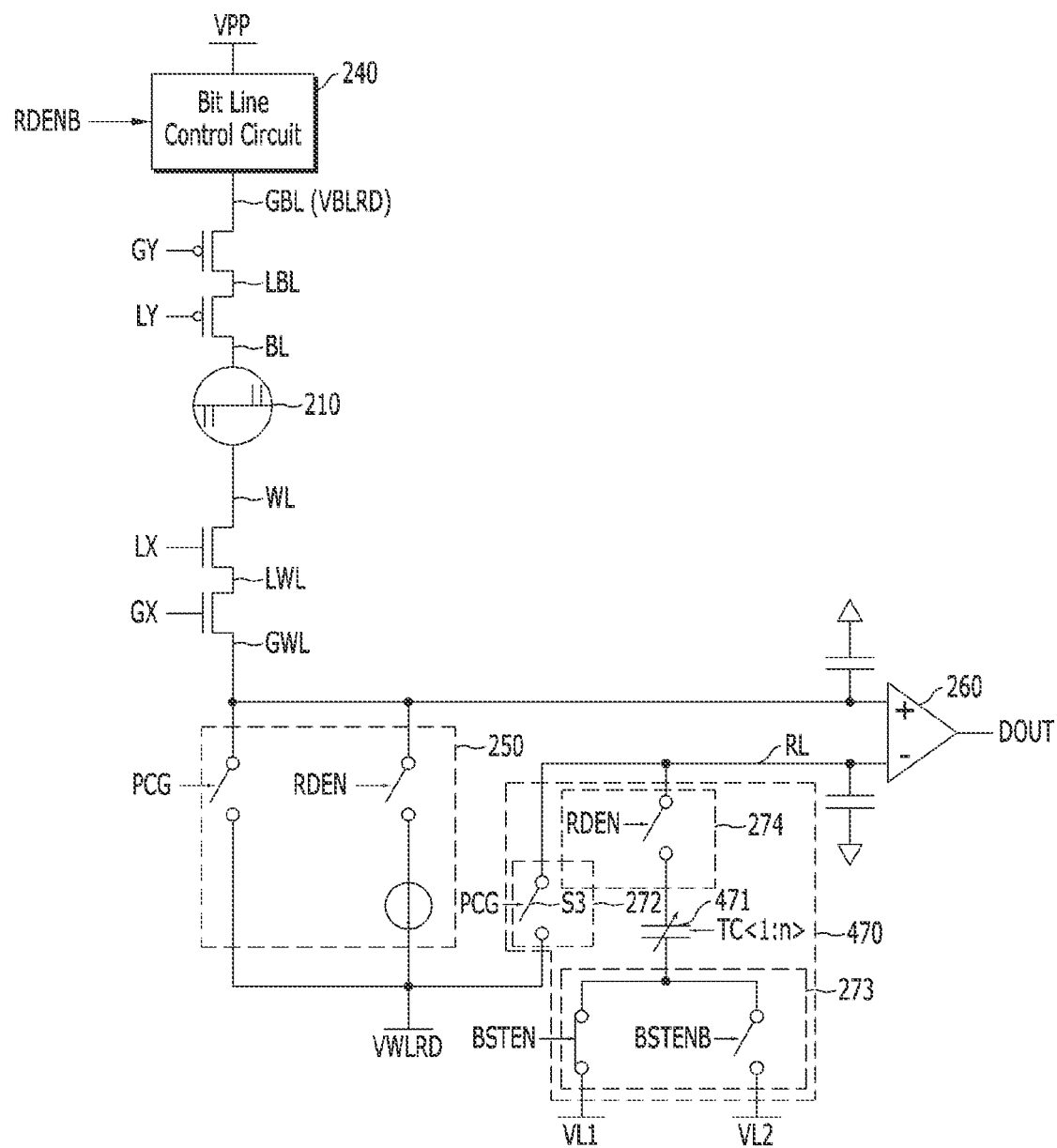
FIG. 4 is a diagram illustrating a configuration of a nonvolatile memory apparatus in accordance with an embodiment.

FIG. 4 is a diagram illustrating a configuration of a nonvolatile memory apparatus 400 in accordance with an embodiment. The nonvolatile memory apparatus 400 has the same configuration as the nonvolatile memory apparatus 200 illustrated in FIG. 2, besides a few components, and the overlapping descriptions for the same components will be omitted herein. Referring to FIG. 4, a reference generator 470 in the nonvolatile memory apparatus 400 may include a variable capacitor 471. The variable capacitor 471 may receive a trimming control signal TC<1:$n$> and have a capacitance that is varied based on the trimming control signal TC<1:$n$>. The nonvolatile memory apparatus 400 may finely adjust the voltage level of the reference line RL by adjusting the capacitance of the variable capacitor 471 in various manners, and thus optimize the voltage level of the reference line RL.

Figure 5:
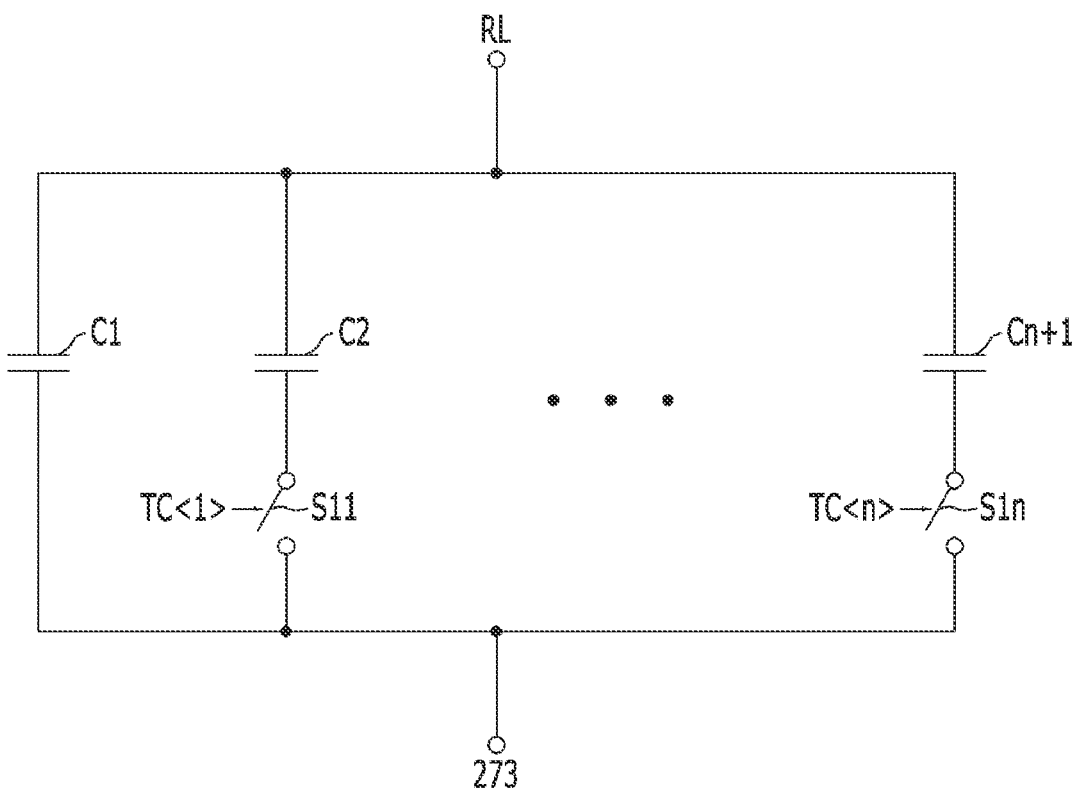
FIG. 5 is a diagram illustrating a configuration of a variable capacitor illustrated in FIG. 4.

FIG. 5 is a diagram illustrating a configuration of the variable capacitor 471 illustrated in FIG. 4. Referring to FIG. 5, the variable capacitor 471 may include (n+1) capacitors and n switches. The (n+1) capacitors may have the same capacitance, and all or some of the (n+1) capacitors may have different capacitances. A first capacitor C1 may be coupled between the reference line RL and the boosting control circuit 273. A second capacitor C2 and a first switch S11 may be coupled in series between the reference line RL and the boosting control circuit 273. The first switch S11 may receive a first bit TC<1> of the trimming control signal. When the first bit TC<1> of the trimming control signal is at a logic high level, the first switch S11 may couple a second capacitor C2 between the reference line RL and the boosting control circuit 273, thereby increasing the capacitance of the variable capacitor 471. An $(n+1)^{th}$ capacitor Cn+1 and an $n^{th}$ switch S1$n$ may be coupled in series between the reference line RL and the boosting control circuit 273. The $n^{th}$ switch S1$n$ may receive an $n^{th}$ bit TC<$n$> of the trimming control signal. When the $n^{th}$ bit TC<$n$> of the trimming control signal is at a logic high level, the $n^{th}$ switch S1$n$ may couple the $(n+1)^{th}$ capacitor Cn+1 between the reference line RL and the boosting control circuit 273, thereby increasing the capacitance of the variable capacitor 471.

Figure 6:
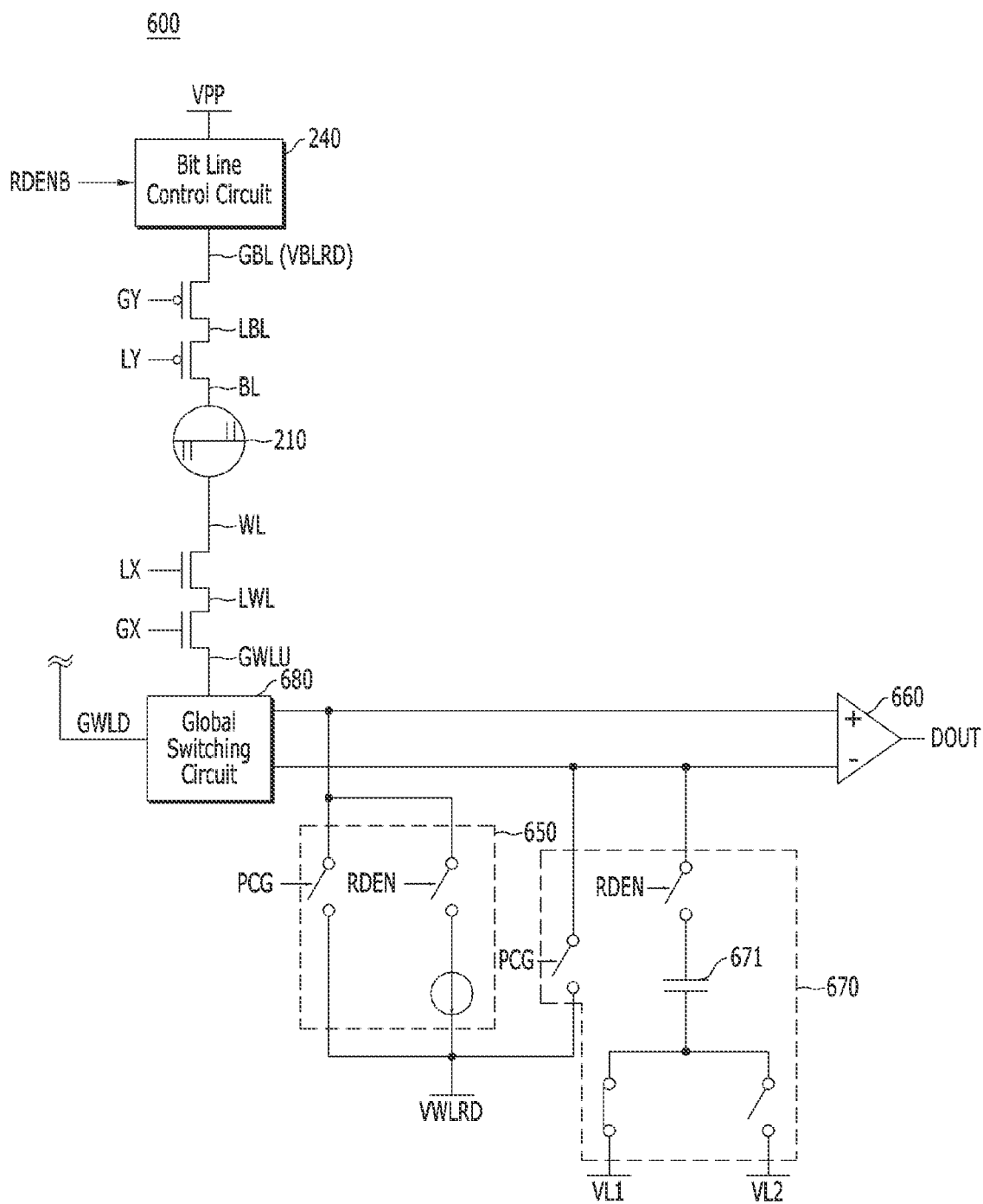
FIG. 6 is a diagram illustrating a configuration of a nonvolatile memory apparatus in accordance with an embodiment.

FIG. 6 is a diagram illustrating a configuration of a nonvolatile memory apparatus 600 in accordance with an embodiment. The nonvolatile memory apparatus 600 has the same configuration as the nonvolatile memory apparatus 200 illustrated in FIG. 2, besides a few components, and the overlapping descriptions for the same components will be omitted herein. Referring to FIG. 6, the memory cell 210 may be coupled to a first global word line GWLU, and a second global word line GWLD may be coupled to the memory cell 210 and another memory cell (not illustrated). The sense amplifier 660 may be coupled to the first and second global word lines GWLU and GWLD. The sense amplifier 660 may include a first input terminal (+) and a second input terminal (−). The first input terminal (+) of the sense amplifier 660 may be coupled to a global word line that is coupled to a memory cell, which is accessed among the memory cell 210 and the other memory cells. The second input terminal (−) of the sense amplifier 660 may be coupled to a global word line that is coupled to a memory cell, which is not accessed among the memory cell 210 and the other memory cells. The first input terminal (+) may be coupled to a selected global word line, and the second input terminal (−) may be coupled to an unselected global word line. The sense amplifier 660 may generate an output signal DOUT by comparing the voltage levels of the first and second input terminals (+ and −).

A word line control circuit 650 may be coupled to the first input terminal (+) of the sense amplifier 660. A reference generator 670 may be coupled to the second input terminal (−) of the sense amplifier 660. The reference generator 670 may include a capacitor 671 that is coupled to the second input terminal (−) and may change the voltage levels/level of the second input terminal (−) and/or the unselected global word line by charging and discharging the capacitor 671.

The nonvolatile memory apparatus 600 may further include a global switching circuit 680. The global switching circuit 680 may be coupled to the first and second global word lines GWLU and GWLD, and the global switching circuit 680 may couple the first and second global word lines GWLU and GWLD to the first and second input terminals (+ and −) of the sense amplifier 660, respectively. When a read operation for the memory cell 210 is performed, the global switching circuit 680 may couple the first global word line GWLU to the first input terminal (+) of the sense amplifier 660 and may couple the second global word line GWLD to the second input terminal (−) of the sense amplifier 660. The sense amplifier 660 may utilize the second global word line GWLD, which is an unselected word line, as a reference line in order to sense the voltage level of the first global word line GWLU, which is the selected global word line. When a read operation for another memory cell is performed, the global switching circuit 680 may couple the first global word line GWLU to the second input terminal (−) of the sense amplifier 660 and may couple the second global word line GWLD to the first input terminal (+) of the sense amplifier 660. The sense amplifier 660 may utilize the first global word line GWLU, which is an unselected word line, as the reference line in order to sense the voltage level of the second global word line GWLD, which is the selected global word line. However, the embodiment of the present disclosure is not limited thereto. In an embodiment, there may be more than two global word lines with configurations that accommodate the additional global word lines.

Figure 7:
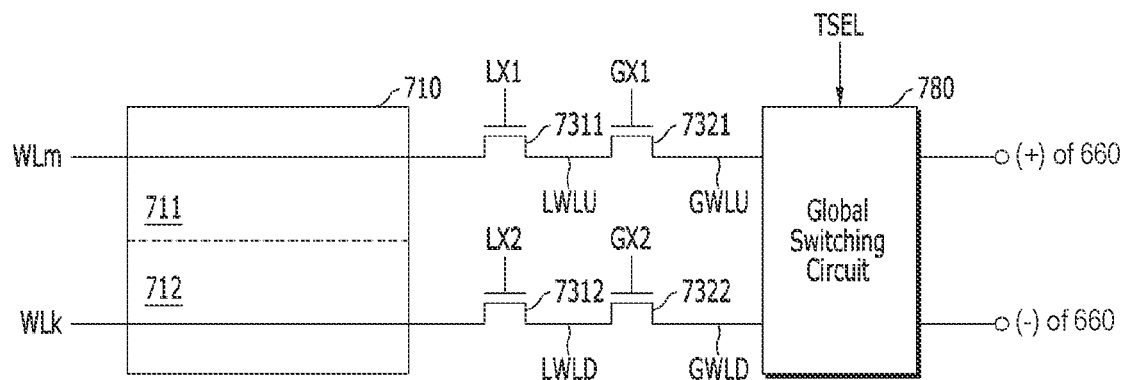
FIG. 7 is a diagram illustrating the coupling relationship between a memory cell array and a global switching circuit.

FIG. 7 is a diagram illustrating the coupling relationship between a memory cell array 710 and a global switching circuit 780, The coupling relationship among the components illustrated in FIG. 7 may be applied as the coupling relationship among the memory cell 210, the other memory cells, the first global word line GWLU, the second global word line GWLD, the global switching circuit 680 and the sense amplifier 660, which are illustrated in FIG. 6. The memory cell array 710 may be configured by an up tile 711 and a down tile 712. The up tile 711 and the down tile 712 may each constitute a sub memory cell array of the memory cell array 710. The down tile 712 may be a sub memory cell array that is adjacent to the up tile 711. The up tile 711 and the down tile 712 may have an equal number of word lines that are arranged therein. In an embodiment, the number of word lines that are arranged in the up tile 711 may be different from the number of word lines that are arranged in the down tile 712. The first global word line GWLU may be coupled to a word line WLm that as arranged in the up tile 711, and the second global word line GWLD may be coupled to a word line WLk that is arranged in the down tile 712. Here, m and k are random natural numbers. The first global word line GWLU may be coupled to the word line WLm through a first local row switch 7311 and a first global row switch 7321. The first local row switch 7311 may couple the word line WLm to a local word line LWLU based on a first local row select signal LX1. The first global row switch 7321 may couple the local word line LWLU to the first global word line GWLU based on a first global row select signal GX1. The second global word line GWLD may be coupled to the word line WLk through a second local row switch 7312 and a second global row switch 7322. The second local row switch 7312 may couple the word line WLk to a local word line LWLD based on a second local row select signal LX2. The second global row switch 7322 may couple the local word line LWLD to the second global word line GWLD based on a second global row select signal GX2. The global switching circuit 780 may couple the first and second global word lines GWLU and GWLD to the first and second input terminals (+ and −) of the sense amplifier 660, respectively. The global switching circuit 780 may couple one of the first and second global word lines GWLU and GWLD to the first input terminal (+) of the sense amplifier 660 and may couple the other of the first and second global word lines GWLU and GWLD to the second input is terminal (−) of the sense amplifier 660 based on a tile select signal TSEL.

The control circuit of the nonvolatile memory apparatus 600 may enable the first and second global row select signals GX1 and GX2 together, based on some bits of a row address signal. The control circuit may enable one of the first and second local row select signals LX1 and LX2 based on the other bits of the row address signal and selectively enable the tile select signal TSEL. For example, when a memory cell that is coupled to the word line WLm that is disposed in the up tile 711 is accessed, the first and second global row select signals GX1 and GX2 may be enabled together. The first local row select signal LX1 may be enabled, but the second local row select signal LX2 might not be enabled. The tile select signal TSEL may be enabled. Therefore, the global switching circuit 780 may couple the first global word line GWLU to the first input terminal (+) of the sense amplifier 660 and may couple the second global word line GWLD to the second input terminal (−) of the sense amplifier 660. On the other hand, when a memory cell that is coupled to the word line WLk that is disposed in the down tile 712 is accessed, the first and second global row select signals GX1 and GX2 may be enabled together. The second local row select signal LX2 may be enabled, but the first local row select signal LX1 might not be enabled. The tile select signal TSEL may be disabled. Therefore, the global switching circuit 780 may couple the second global word line GWLD to the first input terminal (+) of the sense amplifier 660 and may couple the first global word line GWLU to the second input terminal (−) of the sense amplifier 660.

Figure 8:
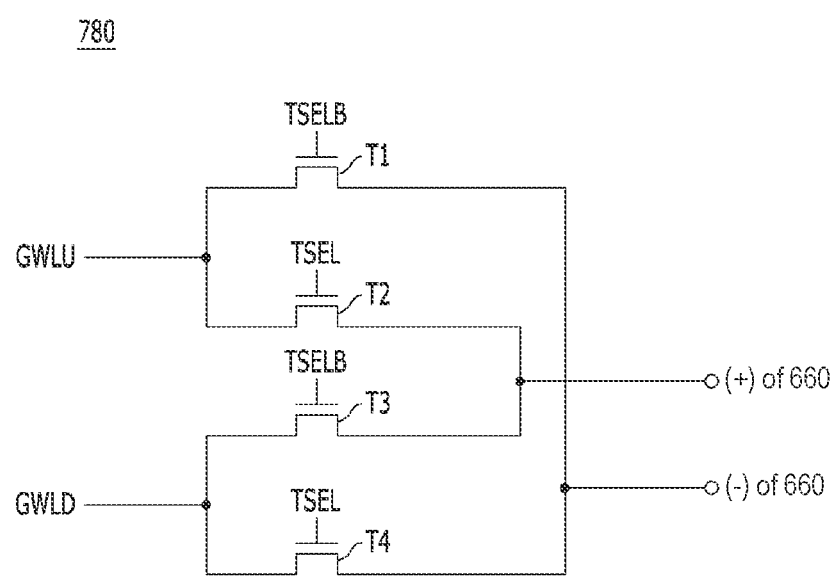
FIG. 8 is a diagram illustrating a configuration of the global switching circuit illustrated in FIG. 7.

FIG. 8 is a diagram illustrating a configuration of the global switching circuit 780 illustrated in FIG. 7. Referring to FIG. 8, the global switching circuit 780 may include a first transistor T1, a second transistor T2, a third transistor T3, and a fourth transistor T4. The first to fourth transistors T1 to T4 may be N-channel MOS transistors. The first transistor T1 may be coupled between the first global word line GWLU and the second input terminal (−) of the sense amplifier 660, and the first transistor T1 may receive a complementary signal TSELB of the tile select signal through a gate thereof. The second transistor T2 may be coupled between the first global word line GWLU and the first input terminal (+) of the sense amplifier 660, and the second transistor T2 may receive the tile select signal TSEL through a gate thereof. The third transistor T3 may be coupled between the second global word line GWLD and the first input terminal (+) of the sense amplifier 660, and the third transistor T3 may receive the complementary signal TSELB of the tile select signal through a gate thereof. The fourth transistor T4 may be coupled between the second global word line GWLD and the second input terminal (−) of the sense amplifier 660, and the fourth transistor T4 may receive the tile select signal TSEL through a gate thereof. When the tile select signal TSEL is enabled to a logic high level, the second and fourth transistors T2 and T4 may be turned on, and the first and third transistors T1 and T3 may be turned off. The second transistor T2 may couple the first global word line GWLU to the first input terminal (+) of the sense amplifier 660, and the fourth transistor T4 may couple the second global word line GWLD to the second input terminal (−) of the sense amplifier 660. When the tile select signal TSEL is disabled to a logic low level, the first and third transistors T1 and T3 may be turned on, and the second and fourth transistors T2 and T4 may be turned off. The first transistor T1 may couple the first global word line GWLU to the second input terminal (−) of the sense amplifier 660, and the third transistor 13 may couple the second global word line GWLD to the first input terminal (−) of the sense amplifier 660.

Figure 9:
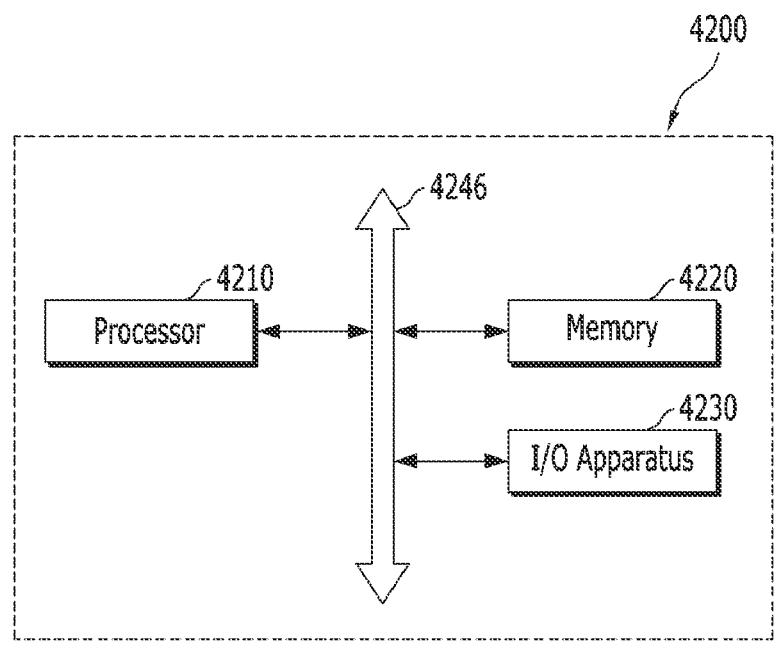
FIG. 9 is a block diagram for describing an electronic device including a nonvolatile memory apparatus in accordance with an embodiment.

FIG. 9 is a block diagram for describing an electronic device including a semiconductor memory apparatus in accordance with an embodiment. Referring to FIG. 9, the electronic device 4200 may include a processor 4210, a memory 4220 and an I/O apparatus 4230. The processor 4210, the memory 4220 and the I/O apparatus 4230 may be coupled through a bus 4246.

The memory 4220 may receive a control signal from the processor 4210. The memory 4220 may store codes and data for an operation of the processor 4210. The memory 4220 may be used to store data accessed through the bus 4246. The memory 4220 may include one or more of the nonvolatile memory apparatuses 100, 200, 400 and 600 in accordance with the present embodiments. For a specific implementation and modification, additional circuits and control signals may be provided.

The electronic device 4200 may constitute various electronic control devices which require the memory 4220. For example, the electronic device 4200 may be used for a computer system, a wireless communication device, for example, a PDA, laptop computer, personal computer, web tablet, wireless phone, mobile phone, digital music player, MP3 player, navigation, SSD (Solid State Disk), household appliance, or all devices capable of transmitting/receiving information in a wireless environment.

Figure 10:
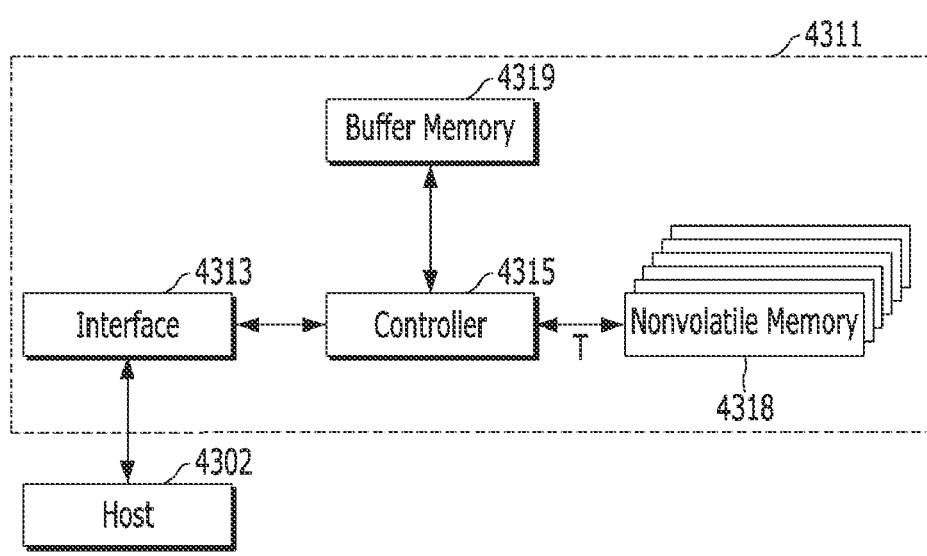
FIG. 10 is a block diagram for describing a data storage device including a nonvolatile memory apparatus in accordance with an embodiment.

FIG. 10 is a block diagram for describing a data storage device including a semiconductor memory apparatus in accordance with an embodiment. Referring to FIG. 10, a data storage device such as an SSD 4311 may be provided. The SSD 4311 may include an interface 4313, a controller 4315, a nonvolatile memory 4318 and a buffer memory 4319.

The SSD 4311 is a device for storing information using a semiconductor device. The SSD 4311 may operate at higher speed than an HDD (Hard Disk Drive), have less mechanical delay and lower failure rate than the HDD, and generate lower heat and noise than the HDD. Furthermore, the SSD 4311 may contribute to reduction in size and weight. The SSD 4311 may be widely used for a notebook PC, net book, desktop PC, MP3 player or portable storage device.

The controller 4315 may be formed adjacent to the interface 4313, and electrically connected to the interface 4313. The controller 4315 may be a microprocessor including a memory controller and a buffer controller. The nonvolatile memory 4318 may be formed adjacent to the controller 4315, and electrically connected to the controller 4315 through a connection terminal T. The SSD 4311 may have a data storage capacity that corresponds to the nonvolatile memory 4318. The buffer memory 4319 may be formed adjacent to the controller 4315 and electrically connected to the controller 4315.

The interface 4313 may be connected to a host 4302, and serve to transmit/receive electrical signals such as data. For example, the interface 4313 may be a device that uses standards such as SATA, IDE, SCSI and/or combinations thereof. The nonvolatile memory 4318 may be connected to the interface 4313 through the controller 4315.

The nonvolatile memory 4318 may serve to store data received through the interface 4313. The nonvolatile memory 4318 may include one or more of the above-described nonvolatile memory apparatuses 100, 200, 400 and 600 in accordance with the present embodiments. Although power supplied to the SSD 4311 is removed, data that is stored in the nonvolatile memory 4318 may be retained.

The buffer memory 4319 may include a volatile memory or nonvolatile memory. The volatile memory may be a DRAM and/or SRAM. The nonvolatile memory may include one or more of the above-described nonvolatile memory apparatuses 100, 200, 400 and 600 in accordance with the present embodiments.

The interface 4313 may have higher data processing speed than the operating speed of the nonvolatile memory 4318. The buffer memory 4319 may serve to temporarily store data. The data received through the interface 4313 may be temporarily stored in the buffer memory 4319 through the controller 4315, and then permanently stored in the nonvolatile memory 4318 according to the data recording speed of the nonvolatile memory 4318.

Furthermore, data which are frequently used among the data that is stored in the nonvolatile memory 4318 may be read in advance and temporarily stored in the buffer memory 4319. That is, the buffer memory 4319 may serve to increase the effective operating speed of the SSD 4311, and to reduce the error occurrence rate of the SSD 4311.

While various embodiments have been described above, it will be understood to those skilled in the art that the embodiments described are examples only. Accordingly, the nonvolatile memory apparatus and the operating method, which are described herein, should not be limited based on the described embodiments.

What is claimed is:

1. A nonvolatile memory apparatus comprising:
   a control circuit configured to apply a read voltage across a target memory cell by applying a first read boundary voltage to a selected global bit line and by applying a second read boundary voltage to a selected global word line;
   a sense amplifier configured to generate an output signal by comparing voltage levels of the selected global word line and an unselected global word line that is not coupled to the target memory cell; and
   a reference generator configured to change the voltage level of the unselected global word line by charging and discharging a capacitor that is coupled to the unselected global word line.

2. The nonvolatile memory apparatus according to claim 1, wherein the control circuit comprises:
   a bit line control circuit configured to provide the first read boundary voltage to the selected global bit line based on a read control signal; and
   a word line control circuit configured to provide the second read boundary voltage to the selected global word line based on the read control signal and configured to allow a clamping current to flow through the global word line,
   wherein a voltage level difference between the first and second read boundary voltages corresponds to the voltage level of the read voltage.

3. The nonvolatile memory apparatus according to claim 1, wherein the voltage level of the global word line is changed between a set sensing voltage and a reset sensing voltage according to data that is stored in the target memory cell, and
   wherein the reference generator is configured to set the voltage level of the unselected global bit line to a voltage level that corresponds to a middle of the set sensing voltage and the reset sensing voltage.

4. The nonvolatile memory apparatus according to claim 1, wherein the reference generator comprises:
   a precharge circuit configured to precharge the unselected global bit line based on a read control signal;
   the capacitor with one end coupled to the unselected global bit line; and
   a boosting control circuit configured to provide the other end of the capacitor with one of a first low voltage and a second low voltage based on a boosting control signal.

5. The nonvolatile memory apparatus according to claim 4, wherein the reference generator further comprises a reference switching circuit that is provided between the unselected global bit line and the one end of the capacitor, and
   wherein the reference switching circuit is configured to couple the one end of the capacitor to the unselected global bit line based on the read control signal.

6. The nonvolatile memory apparatus according to claim 4, wherein the boosting control circuit is configured to provide the first low voltage to the capacitor when the boosting control signal is enabled and configured to provide the second low voltage to the capacitor when the boosting control signal is disabled, wherein the first low voltage has a higher voltage level than the second low voltage.

7. The nonvolatile memory apparatus according to claim 4, wherein the first low voltage has a higher voltage level than the voltage that is provided to the selected global word line by the control circuit.

8. The nonvolatile memory apparatus according to claim 4, wherein the capacitor further receives a trimming control signal, and wherein the capacitor has a capacitance that is varied based on the trimming control signal.

9. The nonvolatile memory apparatus according to claim 1, wherein the selected global word line is disposed in a first tile of a memory cell array, and the unselected global word line is disposed in a second tile of the memory cell array, wherein the nonvolatile memory apparatus further comprises a global switching circuit configured to couple the unselected global world line to the reference line based on a tile select signal to select one of the first and second tiles.

10. An operating method of a nonvolatile memory apparatus that accesses a target memory cell, coupled between a selected bit line and a selected word line, the operating method comprising:

applying a first read boundary voltage to the selected bit line, applying a second read boundary voltage to the selected word line, and precharging a reference line to the second read boundary voltage;

raising the voltage level of the reference line by providing a first low voltage to a capacitor that is coupled to the reference line;

generating an output signal by comparing the voltage level of the selected word line, which is changed according to data that is stored in the target memory cell, to the voltage level of the reference line; and providing a second low voltage to the capacitor that is coupled to the reference line.

11. The operating method according to claim 10, wherein the applying of the second read boundary voltage to the selected world line comprises precharging the selected word line to the second read boundary voltage and allowing a clamping current to flow through the selected word line.

12. The operating method according to claim 10, wherein the first read boundary voltage has a higher voltage level than the second read boundary voltage, and wherein a voltage level difference between the first and second read boundary voltages corresponds to the voltage level of a read voltage.

13. The operating method according to claim 10, wherein the first low voltage has a higher voltage level than the second read boundary voltage.

14. The operating method according to claim 10, wherein the voltage level of the selected word line is changed to a set sensing voltage when the target memory cell is in a low resistance state, and the voltage level of the selected word line is changed to a reset sensing voltage when the target memory cell is in a high resistance state, wherein the raised voltage level of the reference line has a voltage level between the set sensing voltage and the reset sensing voltage.

15. The operating method according to claim 10, wherein the second low voltage has a lower voltage level than the first low voltage.

16. A nonvolatile memory apparatus comprising:

a first global word line coupled to a first memory cell in a first tile of a memory cell array;

a second global word line coupled to a second memory cell in a second tile of the memory cell array;

a sense amplifier comprising a first input terminal and a second input terminal, the sense amplifier configured to generate an output signal by comparing the voltage levels of the first and second input terminals;

a reference generator configured to change the voltage level of the second input terminal by charging and discharging a capacitor that is coupled to the second input terminal; and a global switching circuit configured to couple one of the first and second global word lines to the first input terminal and to couple the other of the first and second global word lines to the second input terminal based on a tile select signal to select one of the first and second tiles.

17. The nonvolatile memory apparatus according to claim 16, wherein the voltage level of the first input terminal is changed between a set sensing voltage and a reset sensing voltage according to data that is stored in the accessed memory cell, wherein the reference generator is configured to set the voltage level of the second input terminal to a voltage level that corresponds to a middle of the set sensing voltage and the reset sensing voltage.

18. The nonvolatile memory apparatus according to claim 16, wherein the reference generator comprises:

a precharge circuit configured to precharge the voltage level of the second input terminal based on a read control signal;

the capacitor with one end coupled to the second input terminal; and a boosting control circuit configured to provide the other end of the capacitor with one of a first low voltage and a second low voltage based on a boosting control signal.

19. The nonvolatile memory apparatus according to claim 18, wherein the reference generator further comprises a switching circuit that is provided between the reference line and the one end of the capacitor, and wherein the reference generator is configured to couple the one end of the capacitor to the reference line based on the read control signal.

20. The nonvolatile memory apparatus according to claim 18, wherein the boosting control circuit is configured to provide the first low voltage to the capacitor when the boosting control signal is enabled and configured to provide the second low voltage to the capacitor when the boosting control signal is disabled, wherein the first low voltage has a higher voltage level than the second low voltage.

21. A nonvolatile memory apparatus comprising:

a control circuit configured to apply a read voltage across a target memory cell through a selected global bit line and a selected global word line;

a sense amplifier configured to generate an output signal by comparing voltage levels of the selected global word line and a reference line;

a capacitor with one end coupled to the reference line; and a boosting control circuit configured to provide the other end of the capacitor with one of a first low voltage and a second low voltage based on a boosting control signal.

22. The nonvolatile memory apparatus according to claim 21, further comprising a precharge circuit configured to precharge the reference line based on a read control signal.

\* \* \* \* \*